(12) United States Patent
England et al.

(10) Patent No.: US 7,528,392 B2
(45) Date of Patent: May 5, 2009

(54) TECHNIQUES FOR LOW-TEMPERATURE ION IMPLANTATION

(75) Inventors: Jonathan Gerald England, Horsham (GB); Richard Stephen Muka, Topsfield, MA (US); D. Jeffrey Lischer, Acton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 203 days.

(21) Appl. No.: 11/733,445

(22) Filed: Apr. 10, 2007

(65) Prior Publication Data

US 2008/0124903 A1 May 29, 2008

Related U.S. Application Data

(60) Provisional application No. 60/861,160, filed on Nov. 27, 2006.

(51) Int. Cl.
H01J 37/317 (2006.01)
H01J 37/20 (2006.01)
H01L 21/425 (2006.01)

(52) U.S. Cl. .................. 250/492.21; 250/398; 250/400; 250/440.11; 250/443.1

(58) Field of Classification Search ............ 250/492.21, 250/398, 400, 440.11, 443.1
See application file for complete search history.

(56) References Cited

U.S. PATENT DOCUMENTS

| | | | |
|---|---|---|---|
| 4,453,080 A | 6/1984 | Berkowitz | |
| 4,599,516 A | 7/1986 | Taya et al. | |
| 5,126,571 A | 6/1992 | Sakai | |
| 5,452,177 A | 9/1995 | Frutiger | |
| 6,388,861 B1 | 5/2002 | Frutiger | |
| 6,686,598 B1 | 2/2004 | Walther | |
| 6,810,298 B2 * | 10/2004 | Emoto | 700/121 |
| 7,064,804 B2 * | 6/2006 | Emoto | 355/30 |
| 7,111,467 B2 | 9/2006 | Apparao et al. | |
| 7,177,007 B2 * | 2/2007 | Emoto | 355/30 |
| 2006/0012939 A1 | 1/2006 | Suuronen et al. | |

FOREIGN PATENT DOCUMENTS

| | | |
|---|---|---|
| EP | 0405855 A2 | 1/1991 |
| EP | 0724284 A2 | 7/1996 |
| EP | 0840356 A2 | 5/1998 |

(Continued)

OTHER PUBLICATIONS

U.S. Appl. No. 11/504,367, England et al.

(Continued)

*Primary Examiner*—Nikita Wells

(57) ABSTRACT

Techniques for low-temperature ion implantation are disclosed. In one particular exemplary embodiment, the techniques may be realized as an apparatus for low-temperature ion implantation. The apparatus may comprise a wafer support mechanism to hold a wafer during ion implantation and to facilitate movement of the wafer in at least one dimension. The apparatus may also comprise a cooling mechanism coupled to the wafer support mechanism. The cooling mechanism may comprise a refrigeration unit, a closed loop of rigid pipes to circulate at least one coolant from the refrigeration unit to the wafer support mechanism, and one or more rotary bearings to couple the rigid pipes to accommodate the movement of the wafer in the at least one dimension.

27 Claims, 7 Drawing Sheets

FOREIGN PATENT DOCUMENTS

| | | | |
|---|---|---|---|
| EP | 1189285 | A1 | 3/2002 |
| EP | 1376185 | A2 | 1/2004 |
| JP | 58194240 | A | 11/1983 |
| WO | 20020027754 | A2 | 4/2002 |
| WO | 0247120 | A2 | 6/2002 |
| WO | 2005-006400 | A2 | 1/2005 |

OTHER PUBLICATIONS

D. R. Wright, et al., "A Closed-Loop Temperature Control System for a Low-Temperature Etch Chuck", SPIE, vol. 1803, p. 321-329, 1992.

Brooks Automation, "Polycold® PGCL Closed Loop Gas Chillers", 2 pages, 2006.

* cited by examiner

TECHNIQUES FOR LOW-TEMPERATURE ION IMPLANTATION

CROSS-REFERENCE TO RELATED APPLICATIONS

This patent application claims priority to U.S. Provisional Patent Application No. 60/861,160, filed Nov. 27, 2006, which is hereby incorporated by reference herein in its entirety.

This patent application is related to U.S. patent application Ser. No. 11/504,367, filed Aug. 15, 2006, which is hereby incorporated by reference herein in its entirety.

FIELD OF THE DISCLOSURE

The present disclosure relates generally to semiconductor manufacturing and, more particularly, to techniques for low-temperature ion implantation.

BACKGROUND OF THE DISCLOSURE

With continued miniaturization of semiconductor devices, there has been an increased demand for ultra-shallow junctions. For example, tremendous effort has been devoted to creating better activated, shallower, and more abrupt source-drain extension junctions to meet the needs of modern complementary metal-oxide-semiconductor (CMOS) devices.

To create an abrupt, ultra-shallow junction in a crystalline silicon wafer, for example, amorphization of the wafer surface is desirable. Generally, a relatively thick amorphous silicon layer is preferred because fewer interstitials from the ion implant will remain after a solid-phase epitaxial growth as part of a post-implant anneal. A thin amorphous layer can lead to more interstitials residing in an end-of-range area beyond the amorphous-crystalline interface. These interstitials may lead to transient enhanced diffusion (TED) of ion-implanted dopants, causing a resultant dopant profile (e.g., P-N or N-P junction) to deepen and/or lose a desired abruptness. As a result, a thinner amorphous layer can adversely increase short channel effects in electronic devices. The interstitials may also lead to the formation of inactive clusters which, particularly in the case of boron, can reduce dopant activation. The interstitials beyond the amorphous-crystalline interface not removed during the activation anneal may combine to form complex end-of-range damage. This damage can lead to junction leakage and yield loss mechanisms. The damage may evolve during later thermal processes by emitting interstitials which can lead to further dopant diffusion and dopant deactivation.

It has been discovered that a relatively low wafer temperature during ion implantation is advantageous for amorphization of a silicon wafer. In current applications of ion implantation, wafers are typically cooled during the implantation process by a gas-assisted process using a water chiller. In most cases, such cooling techniques put the wafer temperature between the chiller temperature (e.g., 15° C.) and a higher temperature having an upper limit imposed to preserve photoresist integrity (e.g., 100° C.). Such a higher temperature may enhance a self-annealing effect, i.e., the annihilation (during the implant) of Frenkel pairs (vacancy-interstitial pairs created from ion beam bombardments). Since amorphization of the silicon occurs only when a sufficient number of silicon atoms are displaced by beam ions, the increase of Frenkel pair annihilation at high temperatures works against the much needed amorphization process, resulting in a higher dose threshold for amorphization and therefore less than ideal shallow junctions.

With other parameters being the same, the thickness of an amorphous silicon layer may increase with decreasing implantation temperature due to a reduction of the self-annealing effect. Thus, better process control and prediction of device performance may be achieved.

Rapid thermal anneals, in which the wafer is heated to, for example, 1000° C. in 5 seconds, have commonly been used to activate implanted dopants. Diffusion-less anneals are becoming preferred post-implant processes, wherein the temperature of a wafer is ramped up much faster (e.g., to 1000° C. in 5 milliseconds) using, for example, a laser or flash lamps, as a heat source. These extremely rapid thermal processes act so quickly that the dopants do not have time to diffuse significantly, but there is also less time for the implant damage to be repaired. It is believed that low-temperature ion implantation may improve the extent of implant damage repair during such diffusion-less anneals.

Other reasons for low-temperature ion implantation also exist.

Although low-temperature ion implantation has been attempted, existing approaches suffer from a number of deficiencies. For example, low-temperature ion implantation techniques have been developed for batch-wafer ion implanters while the current trend in the semiconductor industry favors single-wafer ion implanters. Batch-wafer ion implanters typically process multiple wafers (batches) housed in a single vacuum chamber. The simultaneous presence of several chilled wafers in the same vacuum chamber, often for an extended period of time, requires extraordinary in-situ cooling capability. Pre-chilling an entire batch of wafers is not an easy option since each wafer will experience a different temperature increase while waiting for its turn to be implanted. In addition, extended exposure of the vacuum chamber to the low-temperature wafers may result in icing from residual moisture. In a research environment, some low-temperature ion implantation has been performed in single-wafer ion implanters, often on small substrates mechanically held on sample manipulators. However, such research implementations do not have to consider high, production-worthy throughput of large substrates with low metal and particulate contamination.

In view of the foregoing, it would be desirable to provide a solution for low-temperature ion implantation for use in single-wafer high-throughput ion implanters which overcomes the above-described inadequacies and shortcomings.

SUMMARY OF THE DISCLOSURE

Techniques for low-temperature ion implantation are disclosed. In one particular exemplary embodiment, the techniques may be realized as an apparatus for low-temperature ion implantation. The apparatus may comprise a wafer support mechanism to hold a wafer during ion implantation and to facilitate movement of the wafer in at least one dimension. The apparatus may also comprise a cooling mechanism coupled to the wafer support mechanism. The cooling mechanism may comprise a refrigeration unit, a closed loop of rigid pipes to circulate at least one coolant from the refrigeration unit to the wafer support mechanism, and one or more rotary bearings to couple the rigid pipes to accommodate the movement of the wafer in the at least one dimension.

In another particular exemplary embodiment, the techniques may be realized as a method for low-temperature ion implantation. The method may comprise placing a wafer on a platen that is configured to move the wafer in at least one dimension. The method also may comprise coupling a closed loop of rigid pipes to the platen, at least two portions of the closed loop being connected via one or more rotary bearings to accommodate the movement of the wafer in the at least one dimension. The method may further comprise circulating, via the closed loop of rigid pipes, at least one gaseous coolant to the platen to maintain the wafer in a predetermined temperature range during ion implantation on the wafer.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure facilitate direct wafer cooling during low-temperature ion implantation with an improved design of a wafer support and cooling system. In an ion implanter, rigid coolant pipes may be interconnected and coupled to a platen via one or more rotary bearings, wherein the rigid coolant pipes accommodate coolant circulation at a relatively high pressure and the rotary bearings accommodate platen motions. The rigid coolant pipes may be insulated with a vacuum casing to prevent heat loss and condensation. A gaseous coolant may be preferable since a minor leak will not contaminate the ion implanter. More precise control of wafer temperature may be achieved by incorporating a heating element into the cooling system.

The techniques disclosed herein are not limited to beam-line ion implanters, but are also applicable to other types of ion implanters such as those used for plasma doping (PLAD) or plasma immersion ion implantation (PIII).

Figure 1:
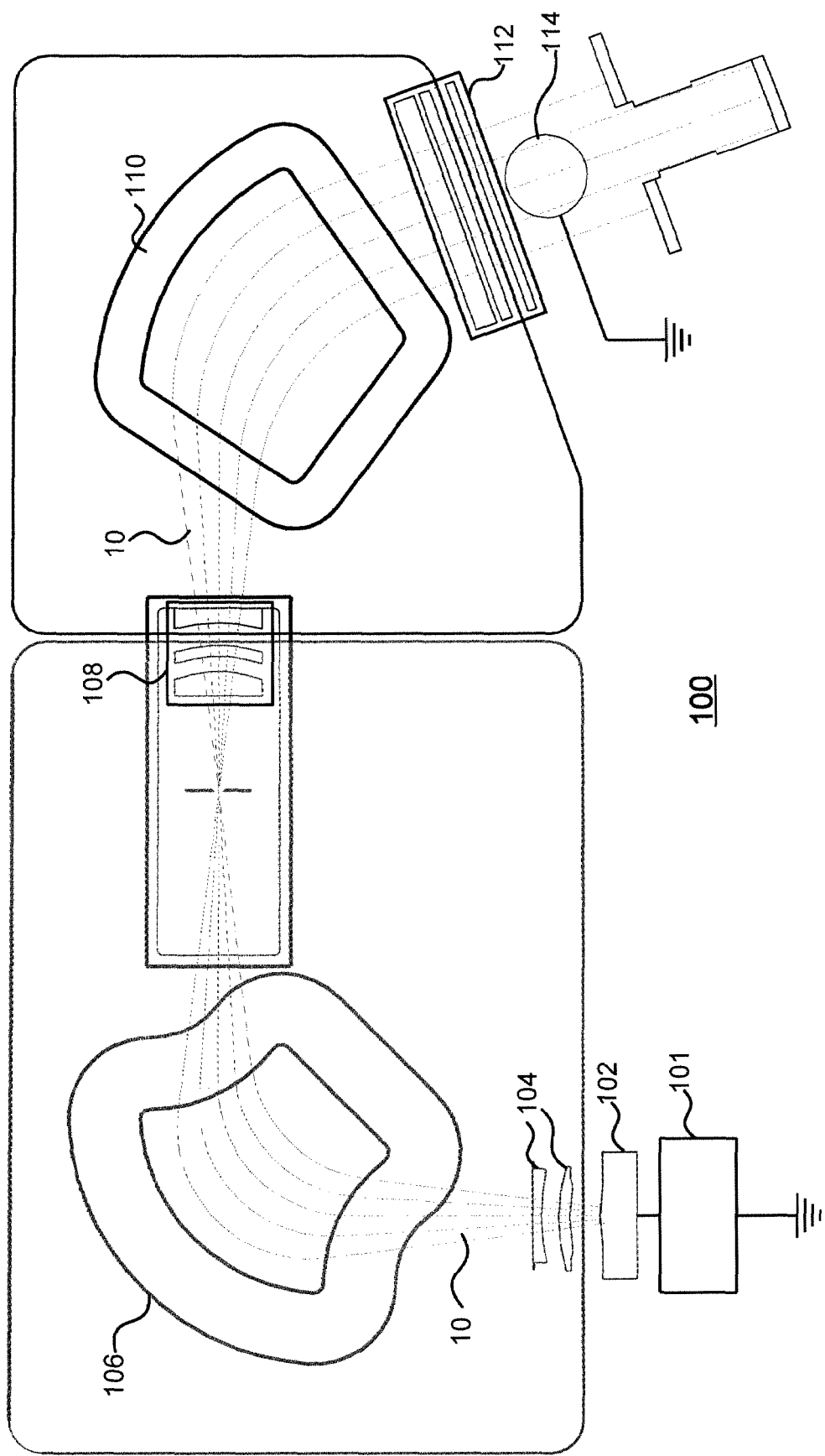
FIG. 1 shows a traditional ion implanter.

FIG. 1 depicts a traditional ion implanter system 100 in which a technique for low-temperature ion implantation may be implemented in accordance with an embodiment of the present disclosure. As is typical for most ion implanter systems, the system 100 is housed in a high-vacuum environment. The ion implanter system 100 may comprise an ion source 102, biased to a potential by power supply 101, and a complex series of beam-line components through which an ion beam 10 passes. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can filter and focus the ion beam 10 before steering it towards a target wafer. During ion implantation, the target wafer is typically mounted on a platen 114 that can be moved in one or more dimensions (e.g., translate, rotate, and tilt) by an apparatus, sometimes referred to as a "roplat."

Figure 2:
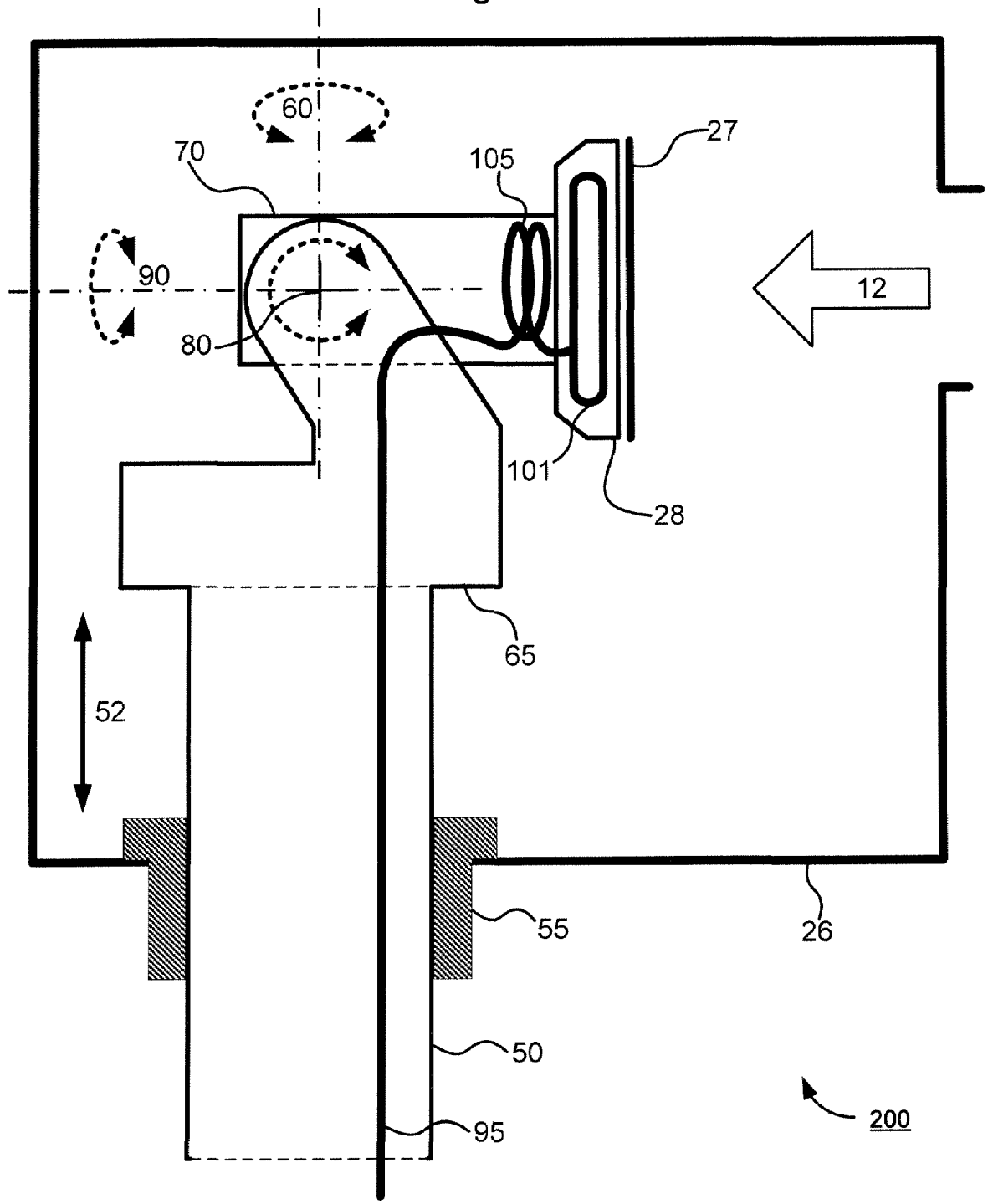
FIG. 2 shows a cross-sectional view of a wafer support assembly that can be modified for low-temperature ion implantation in accordance with an embodiment of the present disclosure.

FIG. 2 shows a cross-sectional view of a wafer support assembly 200 that can be modified for low-temperature ion implantation in accordance with an embodiment of the present disclosure. The wafer support assembly 200 may be implemented in and through an end-station 26 inside which a high vacuum is maintained. The outside of the end-station 26 may be at or near atmospheric pressure. The wafer support assembly 200 may comprise a platen 28, an upper portion 70, a lower portion 65, and an air bearing shaft 50, which are coupled together via one or more bearings and/or joints. A wafer 27 may be mounted onto the platen 28 to receive ion implantation from an ion beam 12.

The air bearing shaft 50 runs through a wall of the end-station 26 and may facilitate a vertical scanning motion (as indicated by a double arrow 52) of the wafer 27. During this motion, an air bearing 55 may retain a vacuum seal between the wall of the end-station 26 and the air bearing shaft 50. The air bearing shaft 50 may also rotate about a vertical axis 60 by, for example, up to ±2° to correct a steering error associated with the ion beam 12. For clarity, components associated with the air bearing shaft 50, such as linear drive motors, linear and angular encoders, differential vacuum pumps, motion control system, and other components, which are well known in the art, are not shown in FIG. 2.

The lower portion 65 of the wafer support assembly 200 may be mounted on top of the air bearing shaft 50. The upper portion 70 of the wafer support assembly 200 may be attached to the lower portion 65 along a tilt axis 80. The two portions 65 and 70 may be in fluid communication with each other and with the air bearing shaft 50, such that the interior of these components may be at or near atmospheric pressure in contrast to the high vacuum in the end-station 26. The wafer 27 may be tilted around the axis 80, relative to a horizontal plane, by, for example, ±60° to accommodate angled ion implantation. The wafer 27 may also be twisted around an axis 90 to accommodate, for example, high-throughput bi- or quad-mode implants. Bearings, vacuum seals, motors, encoders and other parts well known in the art are not shown in FIG. 2.

In existing designs of low-temperature ion implanters, a cooling system may be incorporated into or coupled with the wafer support assembly 200. The cooling system often includes flexible coolant pipes 95 to supply a liquid coolant to the platen 28, a coolant coil 105 to accommodate the twist motion of the platen 28, and a coolant loop 101 to circulate the liquid coolant inside the platen 28. The wafer 27 may be cooled during ion implantation to counteract the heating effect of beam energy deposited into the wafer 27. The wafer 27 may be electrostatically clamped onto the platen 28, and there is typically an 8-micron gap between the wafer 27 and platen 28, so that a backside gas may be introduced to improve thermal conduction between the wafer 27 and platen 28. For clarity, a circuit for the backside gas is not shown in FIG. 2. The wafer 27 may transfer heat through the backside gas into the platen 28, and the liquid coolant flowing through the coolant loop 101 may then carry the excess heat away.

As an example, an arsenic (As) implant at a beam energy of 60 keV and a beam current of 20 mA can deposit approximately 1200 W of energy into the end-station 26. During this ion implantation process, a temperature difference between the wafer 27 and platen 28 may be 40° C. A flow of water, cooled by an external water-cooled heat exchanger (not shown) to 20° C., may be circulated to the platen 28 at a rate of 0.6 gpm (gallons per minute), through flexible, thin-walled 0.188-inch internal diameter plastic pipes. This flow of water may be sufficient to ensure that the wafer temperature does not exceed an upper limit (e.g., 100° C., above which photoresists that mask the wafer are known to degrade).

Figure 3:
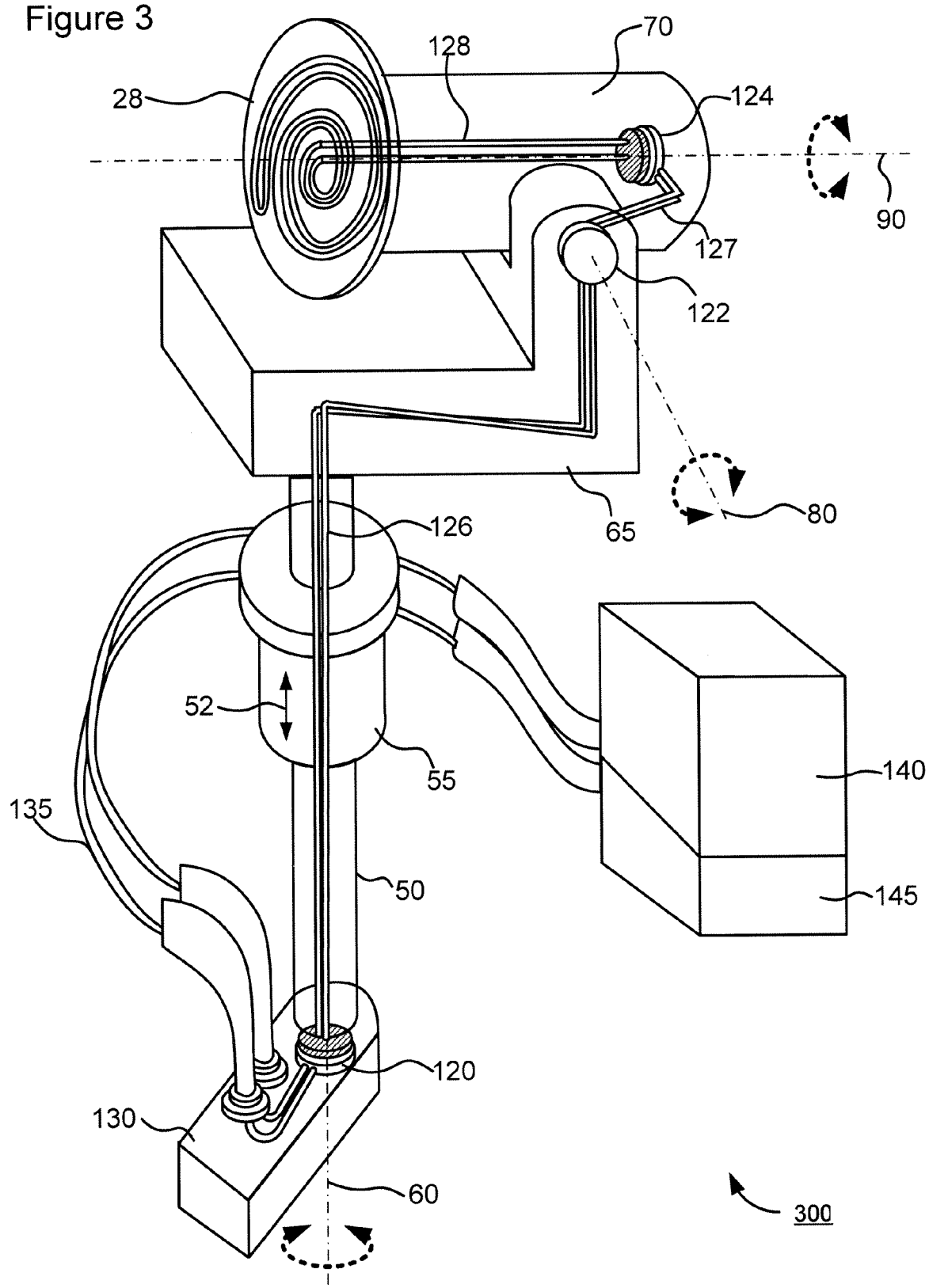
FIG. 3 shows a perspective view of an exemplary wafer support assembly for low-temperature ion implantation in accordance with an embodiment of the present disclosure.

FIG. 3 shows a perspective view of an exemplary wafer support assembly 300 for low-temperature ion implantation in accordance with an embodiment of the present disclosure. Compared to the wafer support assembly 200 shown in FIG. 2, the flexible coolant pipes (95, 101 and 105) may be replace by a series of rigid coolant pipes (e.g., metal pipes) 126, 127 and 128 that are interconnected with rotary bearings 120, 122 and 124 in order to accommodate motions of the platen 28 around the axes 60, 80 and 90, respectively. The rotary bearings 120, 122 and 124 may be identical in design or be different from one another. One exemplary design of a rotary bearing is described below in connection with FIG. 4. The rigid coolant pipes 126 may be further coupled to a refrigerator system 145 via an interface box 130 and connected with insulated, flexible lines 135.

The two portions, 65 and 70, of the wafer support assembly 300 are in fluid communication with each other and with the air bearing shaft 50, such that the interior of these components forms a vacuum space that is separate from the end-station vacuum (not shown). This vacuum space may not only provide thermal insulation for the coolant pipes (126, 127 and 128) and the rotary bearings (120, 122 and 124), but also prevent condensation thereon. The vacuum level inside the air bearing shaft 50 may be achieved with a vacuum pump system 140, such as a rotary pump or rotary and turbo pumps in combination, pumping through the interface box 130. The vacuum level may also be achieved by closing the end of the air bearing shaft 50 with the interface box 130 and allowing the internal cavities to communicate with the high vacuum space within the end-station 26 (not shown in FIG. 3). This communication may be controlled with a valve (not shown) so that, for example, maintenance can be carried out inside the air bearing shaft 50 without disturbing the end-station vacuum. Instead of maintaining a vacuum space within the air bearing shaft 50, its internal cavities may be filled or purged with a dry inert gas. Otherwise, insulation may be desirable for the coolant pipes (126, 127 and 128) and the rotary bearings (120, 122 and 124).

Figure 4:
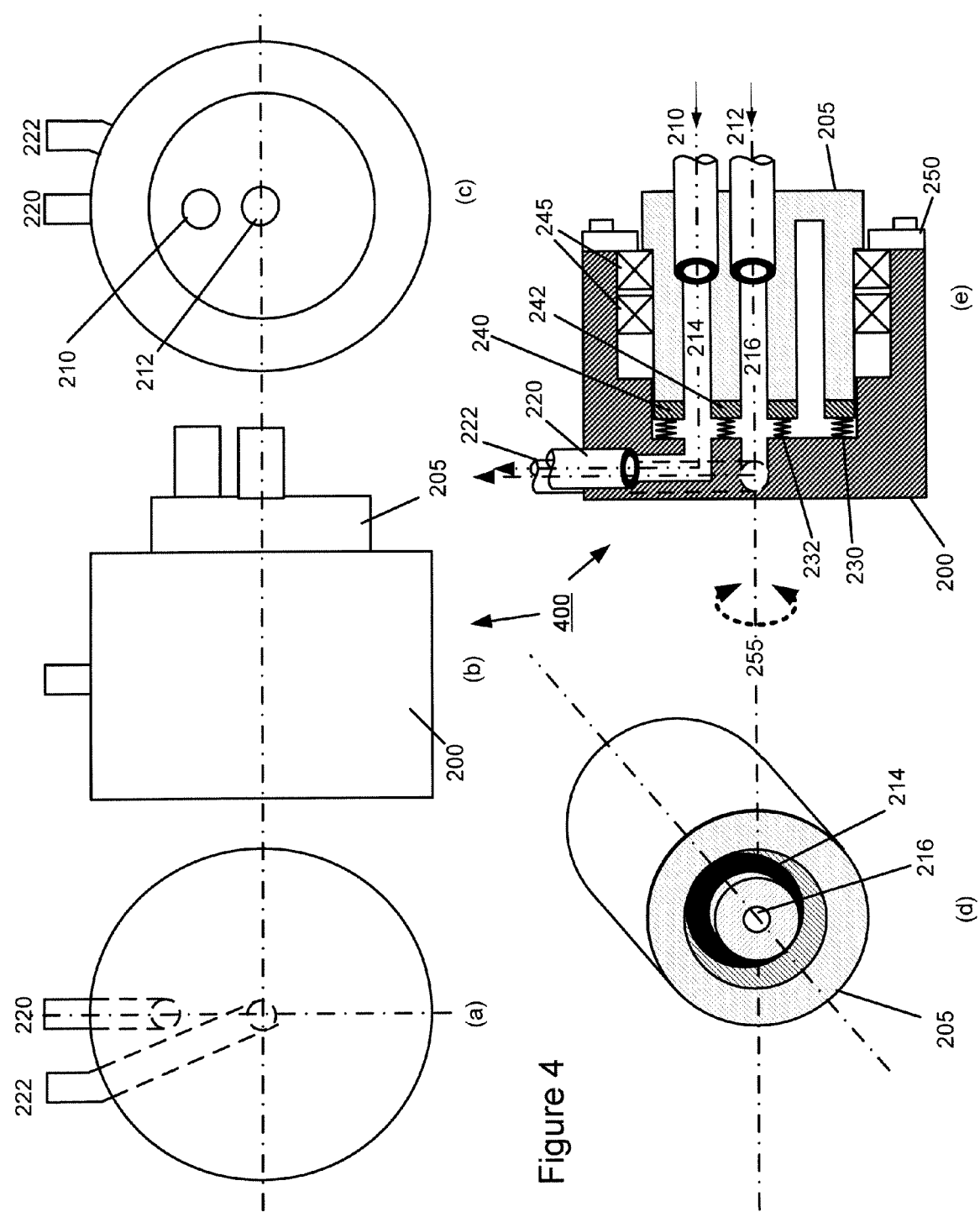
FIG. 4 shows different views of an exemplary design of a rotary bearing in accordance with an embodiment of the present disclosure.

FIG. 4 shows different views of an exemplary design of a rotary bearing 400 in accordance with an embodiment of the present disclosure. The rotary bearing 400 may comprise an inner hub 205 and an outer hub 200 which are coupled with bearings 245 and a cover plate 250. The inner hub 205 may rotate, around an axis 255, within the outer hub 200. Alternatively or in addition, the outer hub 200 may rotate around the axis 255 while the inner hub 205 remains stationary.

A first ingress pipe 210 may communicate with a first egress pipe 220 via an annular channel 214, thereby forming a first flow path. A second ingress pipe 212 may communicate with a second egress pipe 222 via an axial channel 216, thereby forming a second flow path. Note that the designation of "ingress" and "egress" pipes is for illustration purposes only. The coolant flow in any of these flow paths may be in either direction. For example, a coolant may enter along the first flow path and then return via the second flow path after having traveled through cooling channels in a platen (not shown), or the coolant may enter along the second flow path and then return via the first flow path.

It may be appreciated that the rotation of the inner hub 205 does not break any coolant flow in either the first flow path or the second flow path. The annular channel 214 and the axial channel 216 may be sealed with bearings 240 and 242. Sealing surfaces of the bearings 240 and 242 may comprise, for example, Teflon, graphite, graphite impregnated Teflon, ceramic materials such as alumina, aluminum oxy-nitride or silicon carbide, or a metal. Pressure may be maintained between the sealing surfaces by bellows 230 and 232, which may be welded into the stationary hub 200, as shown. Alternatively, there may be a second set of seals (not shown), similar to 240 and 242, located between the outer hub 200 and the bellows 230 and 232.

Other designs of rotary bearings may also be implemented without departing from the spirit of the present disclosure.

Figure 5:
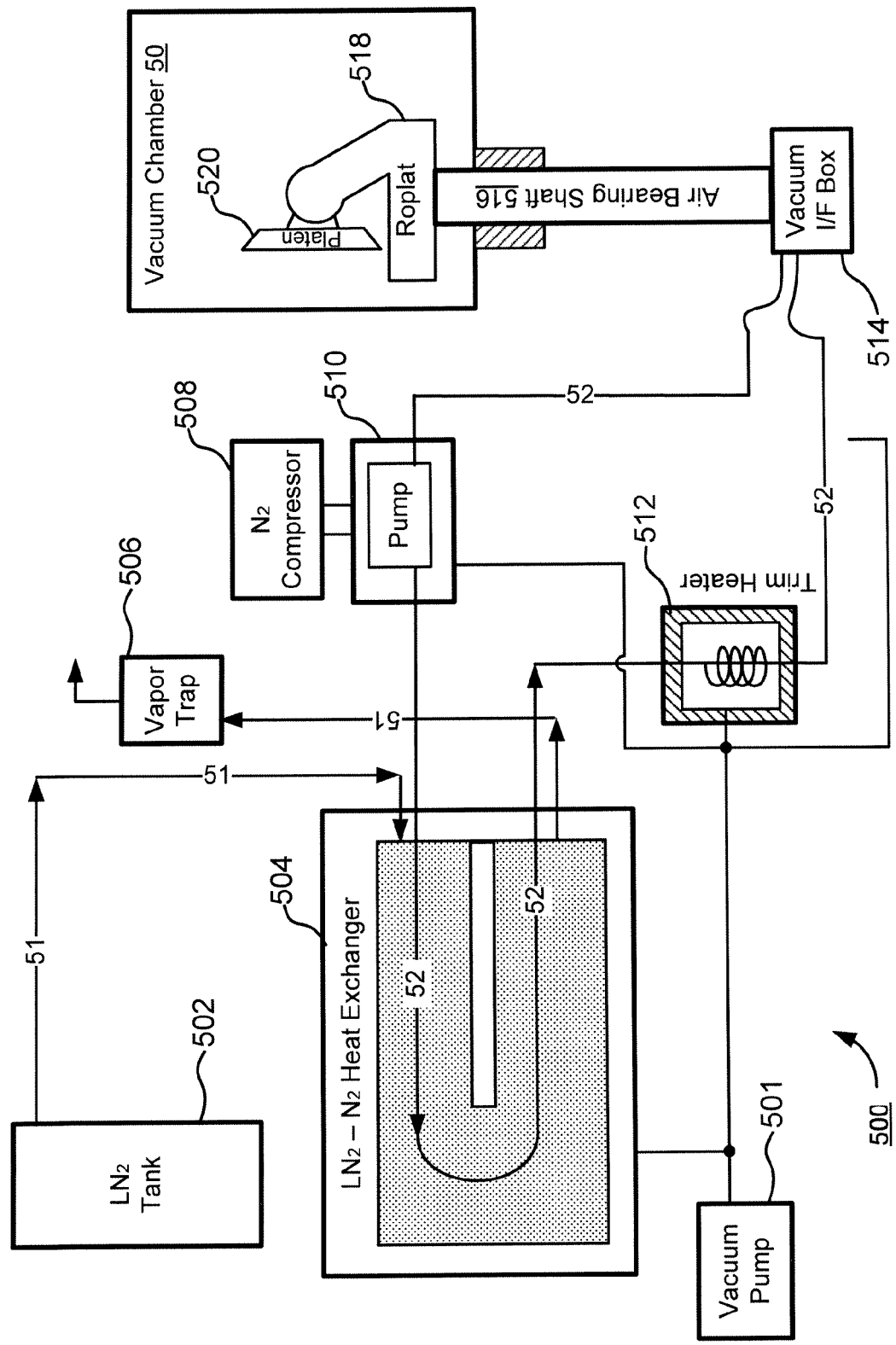
FIG. 5 shows a block diagram illustrating an exemplary heat exchange system for low-temperature ion implantation in accordance with an embodiment of the present disclosure.

FIG. 5 shows a block diagram illustrating an exemplary heat exchange system 500 for low-temperature ion implantation in accordance with an embodiment of the present disclosure. The heat exchange system may comprise a primary loop 51 and a secondary loop 52 of cooling circuits.

The primary loop 51 may circulate liquid nitrogen (LN$_2$) (or cold gaseous nitrogen), as a primary coolant, from an LN$_2$ tank 502 to an LN$_2$—N$_2$ heat exchanger 504 wherein a part of the secondary loop 52 is cooled by the LN$_2$. Nitrogen (N$_2$) vapor generated from the LN$_2$ may be captured in a vapor trap 506.

The secondary loop 52 may circulate N$_2$ as a secondary coolant. A compressor 508 may supply N$_2$ to be transported by a pump 510 to the LN$_2$—N$_2$ heat exchanger 504 where the N$_2$ is cooled down and then further circulated, via a vacuum interface box 514, an air bearing shaft 516, and a roplat 518, to a platen 520 located inside a vacuum chamber 50. The cooled N$_2$ may pre-chill and/or continuously cool a target wafer (not shown) held by the platen 520. After heat transfer in the platen 520, warmer N$_2$ may be pumped to the LN$_2$—N$_2$ heat exchanger 504 to be further circulated.

For a more accurate temperature control of the secondary coolant N$_2$, a trim heater 512 may be coupled to the secondary loop 52. Alternatively, a heating element (not shown) may be incorporated into the platen 520. A coordinated adjustment of the trim heater 512, the LN$_2$—N$_2$ heat exchanger 504, and/or the pumping speed of the pump 510 may cause the secondary coolant N$_2$ (and therefore the platen 520) to have a constant temperature or to remain within a desired temperature range.

A vacuum pump system 501 may serve various components of the heat exchange system 500, such as the pump 510, the trim heater 512, and the vacuum interface box 514.

According to embodiments of the present disclosure, it may be advantageous to use a gas such as nitrogen as the secondary coolant in a low-temperature ion implanter. A suitable coolant gas may comprise chemically inert single species or a mixture of gases such as, for example, nitrogen, clean dry air or argon. Minor leakage from the secondary cooling loop into the ion implanter may be tolerated as long as the leak rate is sufficiently low for vacuum pumps to pump away the leaked coolant gas. Helium or hydrogen may not be a good choice as they are difficult for vacuum pumps to pump away. A leakage of inert gases is not corrosive and will not cause condensation.

Gaseous coolants may require higher flow rates than liquid coolants. For example, a flow rate of water only needs to reach 0.6 gpm in existing water-cooled platens. To accommodate higher flow rates, coolant pipes for a gaseous coolant may have a larger diameter. According to mathematical models of coolant flows, it may be desirable to maintain a turbulent (as opposed to laminar) flow of the gaseous coolant in the coolant pipes to maximize heat transfer. However, if the velocity of the coolant gas becomes too high (e.g., above Mach 0.3 or 30% of the speed of sound in the gas), then ideal gas assumptions may no longer be valid.

Cooling systems using gaseous coolants are commercially available. One example is PolyCold® Systems PGCL2 closed-loop gas chiller from Brooks Automation, Inc. (Chelmsford, Mass.), which is described in U.S. Pat. No. 7,111,467. However, the coolant used in the PolyCold® Systems chiller may be replaced by other coolants such as, for example, liquid nitrogen, solid carbon dioxide, or ammonia. Since a high flow rate is desirable for the coolant gas, the secondary loop is preferably enclosed to re-circulate the coolant gas. Provision may be made to replace any coolant gas that is lost due to minor leakages. However, an open-ended secondary cooling system, such as the PolyCold® Systems PGC gas chillers may also be used, if gas conservation is not a concern.

According to an alternative embodiment, a heat exchange system, such as the one (system 500) shown in FIG. 5, may include two or more heat exchangers. For example, a first heat exchanger may be used for room-temperature ion implants. The first heat exchanger may use water to exchange heat with a secondary loop that cools a platen. For cold implants, the secondary loop may be redirected by, for example, a valve system, to bypass the first heat exchanger and be cooled with a second heat exchanger to a much lower temperature.

According to another embodiment, a single heat exchanger may be used for all temperature ranges, and different coolants may be selected depending on a desired wafer temperature. For example, water may be selected for room-temperature implants, and a different coolant may be selected for low-temperature implants. Liquid coolants may not tolerate being mixed. A preferred embodiment may use a gas as a low-temperature coolant and water as a room-temperature coolant. After a room-temperature implant, the gas (at room temperature or above) may be used to purge water from the heat exchanger and associated cooling channels before cool gas is circulated to the platen. With a single heat exchanger running both gaseous and liquid coolants, it may be desirable to size the cross section of the cooling channels to accommodate both sufficient liquid and gas flows. It may be advantageous to ensure that the coolant flow is turbulent, as laminar flow may have lower heat transfer capability. According to an alternative embodiment, a single heat exchanger may run two different liquid coolants, wherein a gas purge sequence may be run for the heat exchanger when switching from one liquid coolant to another.

In order to use an electrostatic platen for ion implantation at different wafer temperatures, special considerations may need to be given to platen designs.

A typical electrostatic platen comprises multiple layers. First, the platen may be built upon a mechanical base that allows the platen to be attached to the rest of the process equipment. The mechanical base, often made of a metal such as aluminum, may include cooling channels, such as the coolant loop 101 as shown in FIG. 2. Above the mechanical base layer, there may be an insulating layer made of a ceramic material such as alumina or aluminum oxynitride. An electrode layer may be located on top of the insulating layer. The electrode layer may be deposited metal and may consist of either a single electrode or multiple electrode segments. A thin dielectric layer may be placed above the electrode layer. A wafer may be loaded onto the dielectric layer when DC or AC voltages are applied to the electrodes to electrostatically clamp the wafer to the platen. The dielectric layer may macroscopically appear to be fully contacting the back of the wafer, or may have structures such as mesas so that only a percentage of the wafer contacts the dielectric. For example, in one platen the contact area is only 1% of the total wafer area. A gas may then be introduced between the wafer and dielectric to increase thermal conduction from the wafer into the platen.

A traditional platen that uses an insulating layer bonded to a mechanical support base may bow during thermal cycling of the platen because different materials in the platen have differential thermal contractions. A setup temperature of a bond layer, between the insulating layer and the mechanical support base, is the temperature at which the platen is flat. Any temperature different from the setup temperature may cause bowing. If the platen top surface bows for any reason, the wafer mounted thereon may follow the platen surface and also bow. This phenomenon may cause the orientation of different parts of a top surface of the wafer to vary with respect to an implanting ion beam, causing a wide angle distribution and therefore process non-uniformity. Therefore, there may be a need to reduce or eliminate bowing in platens that are intended for a broad range of process temperatures. For example, it may be desirable to carry out both room-temperature and low-temperature implants with a same platen design. It will be appreciated by those skilled in the art that such a platen design is not limited to ion implantation, but may be used in other processes where a single platen might experience significant temperature changes.

According to one embodiment, it may be desirable to construct the mechanical base and insulating layer of a platen out of the same material or out of a single piece of material. In a preferred embodiment, the mechanical base and insulating layer are made from a single piece of ceramic, such as alumina. Alternatively or additionally, bowing of the platen may be reduced if cooling channels are embedded in the insulating layer and the insulating layer is mounted to the mechanical base only at the circumferential edge. Other embodiments to reduce bowing of the platen may involve: (1) placing cooling channels in an active ceramic of the platen, (2) brazing a connector onto a ceramic to access water channels, (3) connecting the ceramic to a metal base by attachment to an edge of the metal base in a manner that minimizes thermal bow, (4) attaching electrical connection regions at the center of an active ceramic layer in a manner that minimizes thermal bow, (5) using polymer top surfaces with the above-described platen, (6) using hard flat ceramic top surfaces with the above-described platen, (7) using a reduced contact area platen with the above-described platen, (8) using heating elements in the above-described platen to get a system to operational temperature, and/or (9) using a ceramic base.

Figure 6:
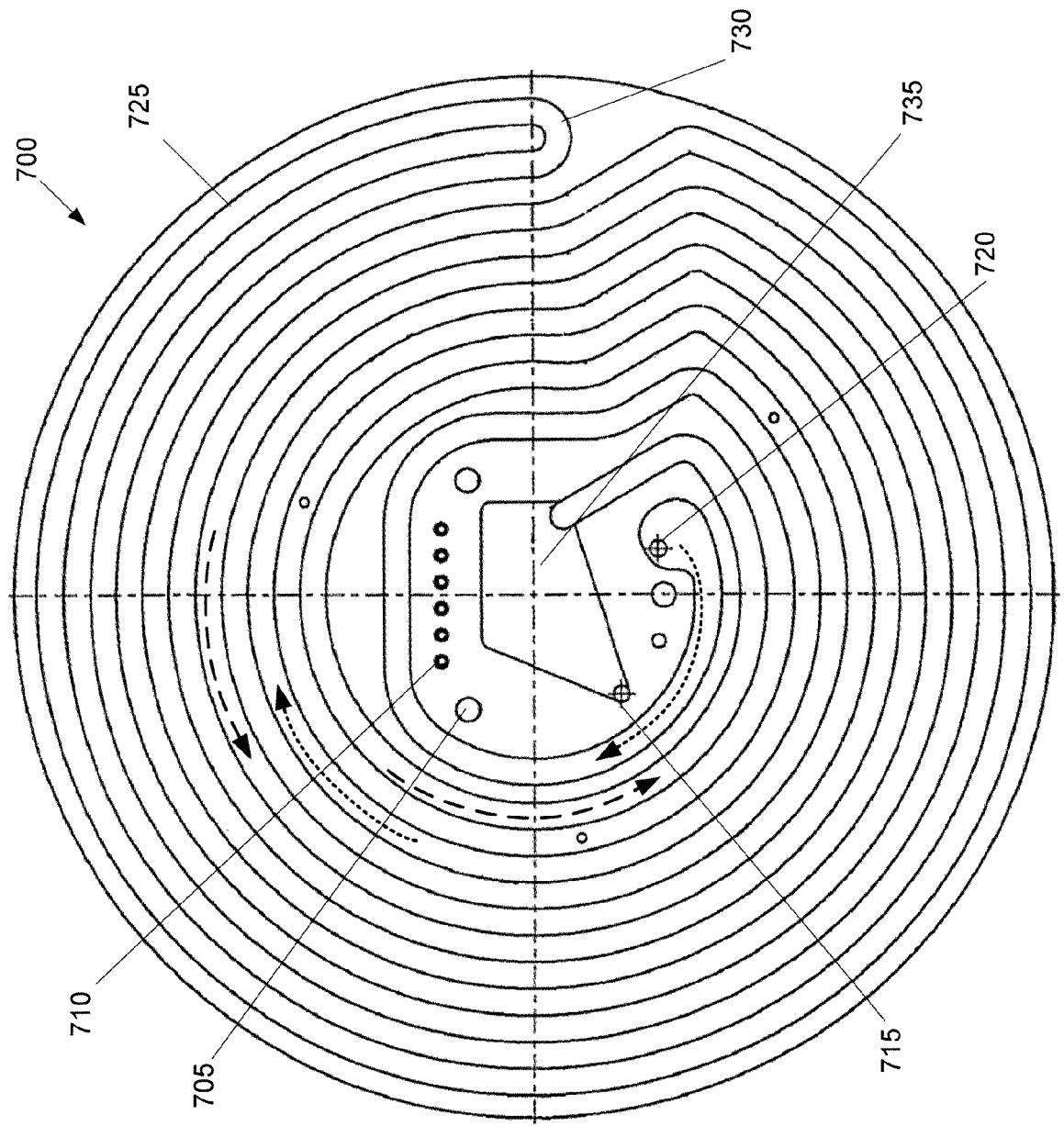
FIG. 6 shows an exemplary pattern of cooling channels in a platen in accordance with an embodiment of the present disclosure.

FIG. 6 shows an exemplary pattern of cooling channels in a platen in accordance with an embodiment of the present disclosure. In this preferred embodiment, cooling channels 725 are machined into a single piece of material 700. The single piece of material 700 may include a first set of clearance holes 705 for wafer lift pins (not shown) and a second set of clearance holes 710 for electrode contacts. A coolant may enter the cooling channels 725 via an entrance channel 720 and leave the cooling channels 725 via an exit channel 715 (or vice versa). The cooling channels 725 are formed in a counter-flow arrangement, such that channels directing the coolant towards a flow turnaround loop 730 are interleaved with those channels directing the coolant in the opposite direction. In FIG. 6, one flow direction of the coolant is marked with dotted lines and the opposite flow direction is marked with dashed lines. Counted in a radial direction, every other cooling channel 725 carries a coolant flow in the same direction. This counter-flow pattern and a central chamber 735 may even out the temperature distribution in the platen.

Figure 7:
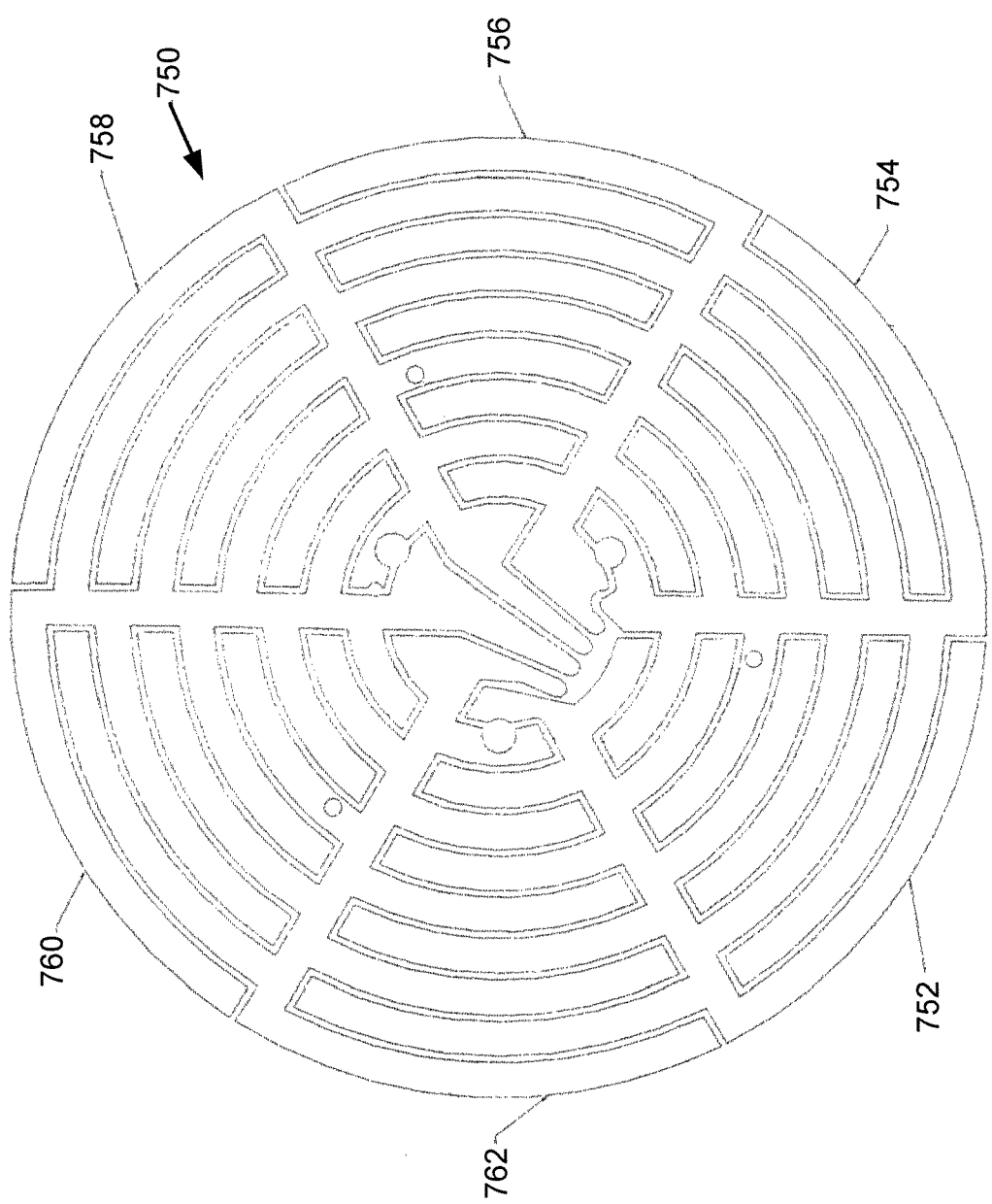
FIG. 7 shows an exemplary electrode pattern of an electrostatic clamp in accordance with an embodiment of the present disclosure.

FIG. 7 shows an exemplary electrode pattern of an electrostatic clamp (ESC) 750 in accordance with an embodiment of the present disclosure.

A typical ESC powered by a phased AC voltage (typically 30 Hz) includes multiple electrode segments (e.g., six) to allow some segments to be energized (so as to apply a wafer clamping force) whilst other electrode segments transition from a positive to negative voltage (so as to apply a reduced or no wafer clamping force). During a loss of wafer clamping force, backside gas pressure may deflect the wafer upwards across the space between electrode segments. The wafer deflection may in turn cause a friction between a backside of the wafer and a surface of the platen, resulting in particle generation, wafer backside particulate contamination, wafer backside damage, and platen surface wear.

To mitigate the above-described wafer deflection problem, a narrow-finger, inter-digitated electrode pattern 750 may be implemented, as shown in FIG. 7. The electrode pattern 750 may include six electrodes 752-762 which form three pairs that are energized by 3-phase or 6-phase voltage supplies. Exemplary methods for implementing a multi-phase clamping apparatus are described in U.S. Pat. No. 5,452,177, which is hereby incorporated by reference herein in its entirety. The electrode pattern 750 is inter-digitated such that the wafer clamping force is distributed over the wafer area, irrespective of the voltage phase. As a result, wafer vibrating may be stopped and therefore particle generation may be reduced. The electrode pattern 750 may be optimized so that a resultant wafer clamping force is uniform over the entire wafer area, independent of the time within the cycle of the applied AC voltages. This exemplary electrode design may reduce wafer deflection to 0.3 micron as predicted by a MathCAD model. This or a similar electrode pattern may be used with full back-side contact dielectric layers or with platens that have low contact area.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for low-temperature ion implantation comprising:
  a wafer support mechanism to hold a wafer during ion implantation and to facilitate movement of the wafer in at least one dimension; and
  a cooling mechanism coupled to the wafer support mechanism, the cooling mechanism comprising:
    a refrigeration unit;
    a closed loop of rigid pipes to circulate at least one coolant from the refrigeration unit to the wafer support mechanism; and
    one or more rotary bearings to couple the rigid pipes to accommodate the movement of the wafer in the at least one dimension.

2. The apparatus according to claim 1, wherein the at least one coolant comprises at least one gaseous coolant.

3. The apparatus according to claim 2, wherein the at least one coolant is selected from a group consisting of: nitrogen, argon, and clean dry air.

4. The apparatus according to claim 2, wherein the at least one gaseous coolant comprises one or more dry, chemically inert gases.

5. The apparatus according to claim 2, wherein the at least one gaseous coolant is circulated in a turbulent flow through the rigid pipes for a desired heat transfer rate.

6. The apparatus according to claim 1, further comprising:
  a casing separating at least one portion of the closed loop of rigid pipes from a first vacuum space in which the wafer is held during ion implantation.

7. The apparatus according to claim 6, wherein the casing provides a second vacuum space to thermally insulate the at least one portion of the closed loop of rigid pipes.

8. The apparatus according to claim 7, further comprising:
  a valve in the casing that, if opened, allows a communication between the first vacuum space and the second vacuum space.

9. The apparatus according to claim 6, wherein the casing comprises an air bearing shaft that runs through a wall of an end station, the end station encompassing the first vacuum space.

10. The apparatus according to claim 1, wherein each rotary bearing is configured to couple with two ingress pipes and two egress pipes, and wherein a first ingress pipe communicates with a first egress pipe via an annular channel and a second ingress pipe communicates with a second egress pipe via an axial channel, such that a rotation of the two ingress pipes does not cause the two egress pipes to rotate.

11. The apparatus according to claim 1, wherein the refrigeration unit comprises a first heat exchanger to cool a portion of the closed loop of rigid pipes with one or more coolants selected from a first group consisting of: liquid nitrogen, solid carbon dioxide, liquid ammonia, and mixed refrigerants, the first heat exchanger causing the wafer to be in a first temperature range.

12. The apparatus according to claim 11, further comprising:
  a second heat exchanger to cause the wafer to be in a second temperature range that is different from the first temperature range.

13. The apparatus according to claim 1, further comprising:
  a trim heater to heat a portion of the closed loop of rigid pipes, thereby causing the wafer held by the wafer support mechanism to be within a desired temperature range.

14. The apparatus according to claim 1, wherein the at least one coolant comprises two coolants, and the apparatus further comprising:

a selection mechanism to select one of the two coolants to achieve a desired wafer temperature range.

15. The apparatus according to claim 14, wherein the two coolants comprise water to cool the wafer for room-temperature ion implantation and a gaseous coolant to cool the wafer to a temperature substantially lower than room temperature.

16. The apparatus according to claim 14, wherein the two coolants comprise two liquid coolants, and wherein the closed loop of rigid pipes are purged with a gas when switching between the two liquid coolants.

17. The apparatus according to claim 1, wherein the wafer support mechanism comprises a plurality of cooling channels so arranged as to cause a counter-flow pattern.

18. The apparatus according to claim 1, wherein the wafer support mechanism comprises an electrostatic clamp having multiple inter-digitated electrode segments.

19. The apparatus according to claim 18, wherein the electrostatic clamp is energized by a multi-phase voltage supply.

20. A method for low-temperature ion implantation comprising the steps of:
placing a wafer on a platen that is configured to move the wafer in at least one dimension;
coupling a closed loop of rigid pipes to the platen, at least two portions of the closed loop being connected via one or more rotary bearings to accommodate the movement of the wafer in the at least one dimension; and
circulating, via the closed loop of rigid pipes, at least one gaseous coolant to the platen to maintain the wafer in a predetermined temperature range during ion implantation on the wafer.

21. The method according to claim 20, further comprising:
separating at least one portion of the closed loop of rigid pipes from a first vacuum space in which the wafer is held during ion implantation.

22. The method according to claim 21, further comprising:
providing a second vacuum space to thermally insulate the at least one portion of the closed loop of rigid pipes.

23. The method according to claim 22, further comprising:
allowing a communication between the first vacuum space and the second vacuum space via a valve.

24. The method according to claim 20, wherein the at least one gaseous coolant is circulated in a turbulent flow through the rigid pipes for a desired heat transfer rate.

25. The method according to claim 20, further comprising:
heating a portion of the closed loop of rigid pipes, thereby causing the wafer held by the wafer support mechanism to be within a desired temperature range.

26. The method according to claim 20, further comprising:
selecting a second coolant different from the at least one gaseous coolant to achieve a different wafer temperature range.

27. The method according to claim 26, wherein the second coolant comprises water to cool the wafer for room-temperature ion implantation, and wherein the at least one gaseous coolant cools the wafer for ion implantation at a temperature substantially lower than room temperature.

* * * * *